(12) United States Patent
Bae

(10) Patent No.: US 11,397,301 B2
(45) Date of Patent: Jul. 26, 2022

(54) SENSORS INCLUDING A HOUSING, A DIAMOND DIAPHRAGM, AND AN OPTICAL CABLE, AND METHODS OF MANUFACTURING THE SENSORS

(71) Applicant: HOWARD UNIVERSITY, Washington, DC (US)

(72) Inventor: Hyung D. Bae, Washington, DC (US)

(73) Assignee: HOWARD UNIVERSITY, Washington, DC (US)

( * ) Notice: Subject to any disclaimer, the term of this patent is extended or adjusted under 35 U.S.C. 154(b) by 273 days.

(21) Appl. No.: 16/448,700

(22) Filed: Jun. 21, 2019

(65) Prior Publication Data

US 2019/0391356 A1 Dec. 26, 2019

Related U.S. Application Data

(60) Provisional application No. 62/688,039, filed on Jun. 21, 2018.

(51) Int. Cl.
| | |
|---|---|
| *G02B 6/44* | (2006.01) |
| *H01J 37/32* | (2006.01) |
| *C23C 16/27* | (2006.01) |
| *G01L 9/00* | (2006.01) |

(52) U.S. Cl.
CPC ............ *G02B 6/4486* (2013.01); *C23C 16/27* (2013.01); *G01L 9/0079* (2013.01); *H01J 37/32* (2013.01); *G02B 6/4471* (2013.01); *H01J 2237/3341* (2013.01)

(58) Field of Classification Search
CPC ................................ G02B 6/4486; H01J 37/32
See application file for complete search history.

(56) References Cited

U.S. PATENT DOCUMENTS

| | | | | |
|---|---|---|---|---|
| 5,365,789 | A | * 11/1994 | Totterdell ............ | G01L 9/0079 73/705 |
| 6,115,528 | A | * 9/2000 | Schmucker ........... | G01N 21/01 356/301 |
| 8,435,597 | B2 | * 5/2013 | Koide .................... | C30B 31/06 427/162 |
| 2006/0119946 | A1 | * 6/2006 | Lai ...................... | G02B 27/0994 359/600 |
| 2019/0064099 | A1 | * 2/2019 | Jackman ............. | G01N 27/308 |
| 2020/0411646 | A1 | * 12/2020 | Mizuochi ............... | C01B 32/26 |

* cited by examiner

*Primary Examiner* — Joseph L Williams
(74) *Attorney, Agent, or Firm* — Sughrue Mion, PLLC

(57) ABSTRACT

In some embodiments, apparatuses and methods are provided herein useful for sensing pressure. In some embodiments, miniature housings are manufactured at ends of optical fibers. In some embodiments, a diamond diaphragm is provided on a hollow housing that receives a fiber optic cable and is sealed to form a Fabry-Perot cavity. In some forms, a plurality of sensors may be manufactured in batch.

17 Claims, 5 Drawing Sheets

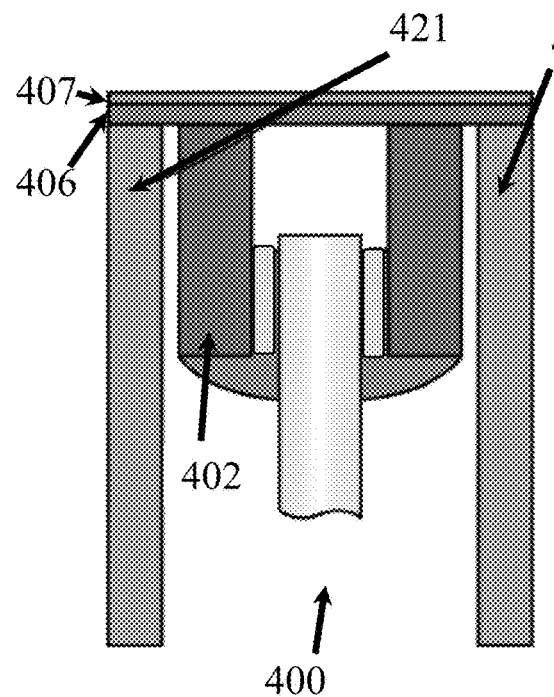
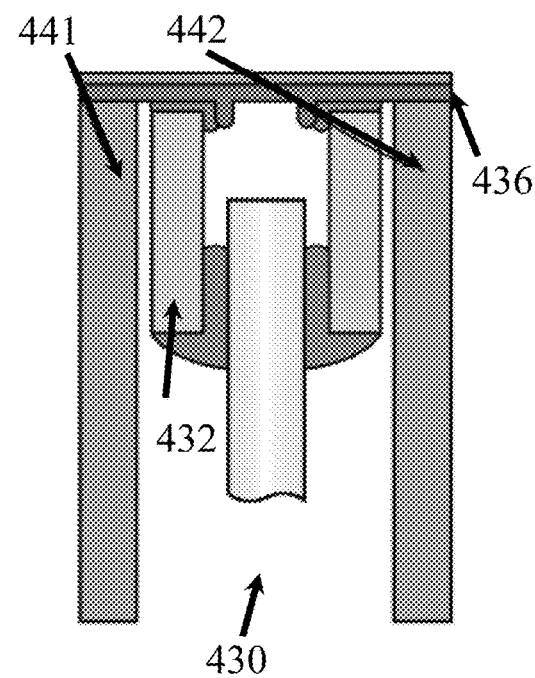
FIG. 4a    FIG. 4b
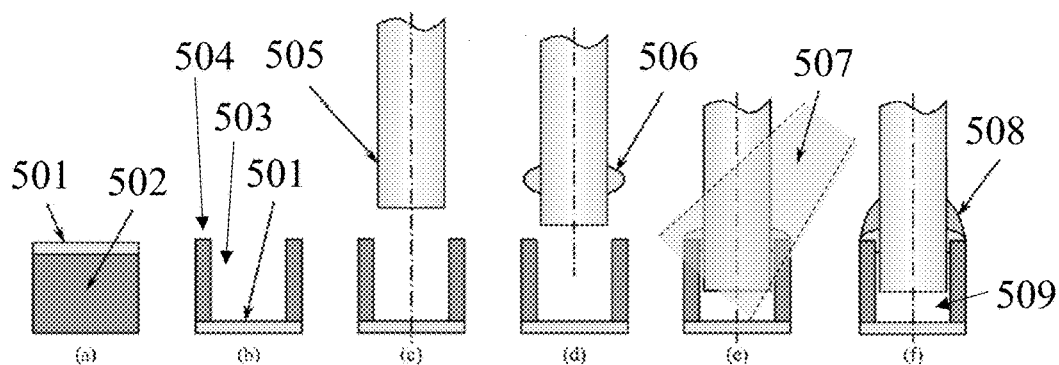
FIG. 5

SENSORS INCLUDING A HOUSING, A DIAMOND DIAPHRAGM, AND AN OPTICAL CABLE, AND METHODS OF MANUFACTURING THE SENSORS

CROSS-REFERENCE TO RELATED APPLICATIONS

This application claims the benefit of U.S. Provisional Application No. 62/688,039, filed Jun. 21, 2018, which is hereby incorporated herein by reference in its entirety.

TECHNICAL FIELD

This invention relates generally to sensors, particularly fiber optic pressure sensors.

BACKGROUND

Interest in the use of miniature fiber-optic pressure sensors for medical and industrial applications has progressively increased over the recent decades due at least in part to their unique attributes such as ultra-fast dynamic response, micro-scale size, high sensitivity, immunity to electromagnetic interference, and the convenience of light transmission/detection through optical fibers. The compact dimensions of the fiber-optic sensors significantly improve the spatial resolution of measurements and, in the case of medical applications, patients' comfort level. Various types of miniature optic sensors reported in the literature are based on the Fabry-Perot optical cavity. An extrinsic Fabry-Perot (FP) cavity is formed at the tip of an optical fiber by using the end of the optical fiber surface and a reflective miniature diaphragm built on a support structure. The diaphragm deflects in response to variations of ambient pressure and causes changes in the interference signal generated by the FP cavity.

Fiber optic sensors has been widely used for various applications such as chemical, acoustic, pressure, strain, and temperature sensing due to their EMI inertness, high sensitivity, high bandwidth, small form factor, and general robustness of sensor structures.

Single crystal sapphire has been identified as a sensor material for high temperature sensing due to its high melting temperature (i.e. 2040° C.). However, fabrication of sensors with sapphire requires polishing and high temperature fusion splicing using high power laser, which are generally costly procedures. In addition, the temperature sensitivity of fiber optic pressure sensors presents a drawback in terms of accuracy of the measured parameter, particularly when measuring pressure.

There remains a need for improved sensors that are capable of operating accurately under a wide variety of conditions.

SUMMARY

Diamond-based sensor are provided for measurement of variables at various conditions. In some forms, a diamond diaphragm is mounted across a cavity of a hollow housing. The diaphragm may be mounted to the sensor housing by fusing diamond material of the diaphragm to the housing (in some embodiments by depositing or growing the diaphragm material directly onto the housing) or by coupling the diaphragm and housing with adhesive, such as a ceramic adhesive. In one form, a sensor has a silicon housing coupled to both an optical cable and a diamond diaphragm. In some forms the fabrication of the sensor is scalable using a batch process for the diamond diaphragm and sensor housing structure and an automated fiber insertion and mounting process.

In some forms, the housing of the sensor may be generally cylindrical with a generally cylindrical cavity formed therein extending from a first end to a second end of the housing. One end of the housing may be covered by a diamond diaphragm structure, such as a polycrystalline diamond layer, while the opposite end of the housing may receive an optical cable. The optical cable may be, for instance, fiber optic cable of various diameters, sapphire optical cable, or other suitable optic cable. In some forms, one or both ends of the housing cavity are sealed with one or more adhesives. In some forms, both polymer and ceramic adhesives are used to secure the optical cable to the housing. In such a two-adhesive system, the polymer adhesive provides air-tight sealing of the sensor cavity and the ceramic adhesive ensures a good linearity of pressure sensing. An anti-oxidation barrier may be provided over the diaphragm, for instance a layer of titanium oxide, silicon oxide, aluminum oxide, or combinations thereof.

Sensors of the type described may be low-cost and highly accurate with improved chemical resistance and temperature resistance, and can be of benefit in a variety of fields such as biomedical sensing and industrial sensing.

A method of manufacturing one or more sensors may in some forms comprise depositing a diamond film layer on a first side of a substrate, etching a cavity in a second side of the substrate, the cavity extending from the second side of the substrate to the diamond film layer, disposing a cable within the cavity at the second side of the substrate, and joining an optical cable to the substrate with at least one adhesive. These processes may be performed in batch to simultaneously manufacture a plurality of sensors at one time. For instance, a batch of at least 100 sensors may be formed essentially simultaneously in an automated process. Depositing the diamond film layer may comprise a hot filament chemical vapor deposition in some embodiments. Etching of the cavity or cavities in the silicon comprises deep reactive ion etching. The method may further comprise, pursuant to certain embodiments, joining an optical cable to the substrate by applying a UV-curable adhesive to the optical cable, subjecting the UV-curable adhesive to ultraviolet radiation when the UV-curable adhesive is in contact with the optical cable and the substrate in an amount effective to cure the UV-curable adhesive, and applying a ceramic adhesive to the UV-curable adhesive.

BRIEF DESCRIPTION OF THE DRAWINGS

Disclosed herein are embodiments of systems, apparatuses and methods pertaining to sensors including a deflectable diamond diaphragm. This description includes drawings, wherein:

FIGS. 4*a* and 4*b* are cross-sectional views of sensors equipped with heat packages in accordance with several embodiments.

FIG. 5 shows sequential steps of one process for manufacturing a sensor in accordance with some embodiments.

Figure 1:
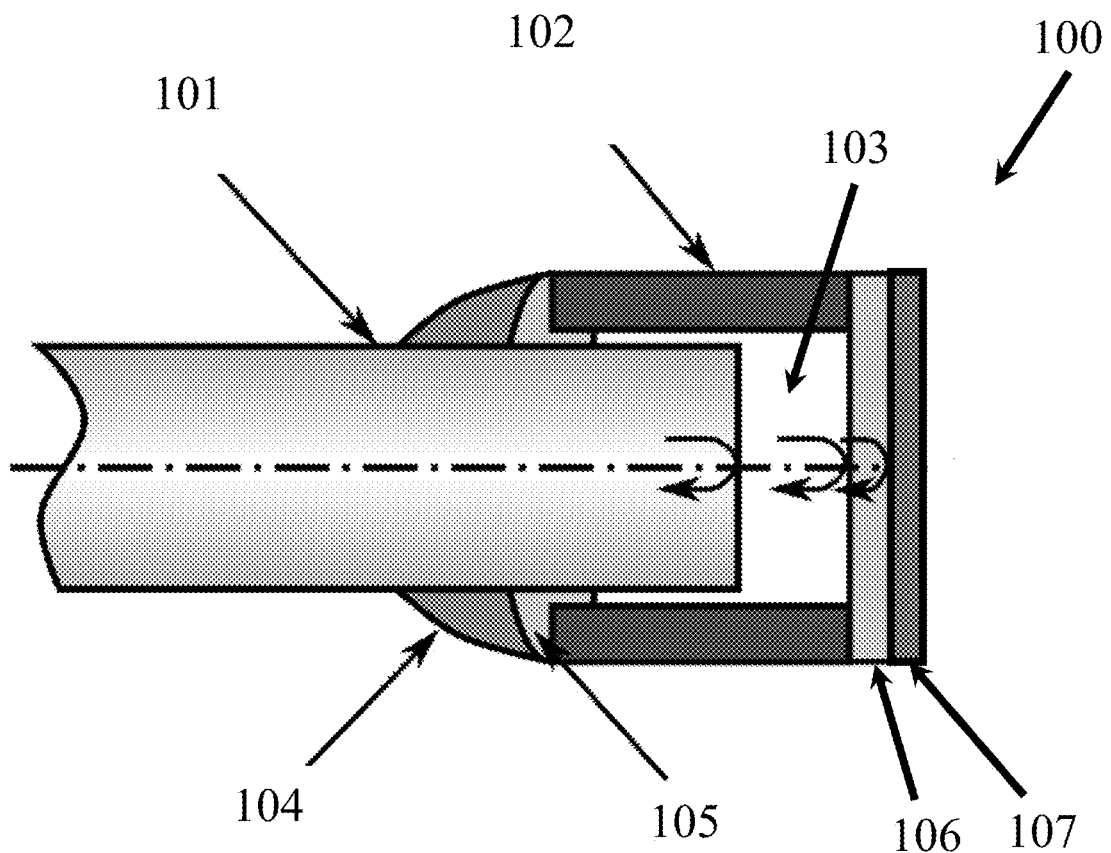
FIG. 1 is a cross-sectional view of one example of a sensor in accordance with some embodiments.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to various embodiments, systems, apparatuses and methods are provided herein useful to provide a high temperature pressure sensor containing a diamond diaphragm, such as a diaphragm comprising heteroepitaxial polycrystalline diamond film. In some forms, the sensor is composed of a polycrystalline diamond diaphragm that covers a cavity structure of a housing made from silicon or other materials. In some forms, a sensor comprises a housing structure having a cavity extending from a first end of the housing to a second end of the housing a diamond diaphragm extending across the cavity at the first end of the housing and an optical cable or fiber disposed in the cavity at the second end of the housing, wherein the optical cable is mounted to the housing with a UV curable adhesive and a ceramic adhesive. In some forms, the housing comprises silicon. In some forms, the diamond diaphragm comprises polycrystalline diamond. In some forms, the sensor further comprising an anti-oxidation barrier disposed on a side of the diamond diaphragm opposite the housing structure, the anti-oxidation barrier comprising one or more layers of titanium oxide, silicon oxide, aluminum oxide, or combinations thereof. In some forms, the fabricated sensors can be used in temperatures up to 1700° C. in non-oxygen environments.

Polycrystalline diamond advantageously has high manufacturability, high mechanical strength, and high thermal conductivity. In some forms, diamond films can be grown in wafer scale, providing good control over thickness. Additionally, diamond layers can be patterned using conventional photolithography and reactive ion etching processes. In some forms, an oxidation barrier is provided to protect the diamond diaphragm in order to improve operation of the sensor in an oxygen rich environment. A Fabry-Perot cavity is formed between the tip of the optical fiber and the diaphragm. The diaphragm deflects in response to variations of ambient pressure when the opposite end of the cavity is sealed, causing changes in the interference signal generated by the Fabry-Perot cavity which are then transmitted along the optical fiber.

In some forms, polycrystalline diamond can be grown by chemical vapor deposition (CVD). Polycrystalline diamond has many unique properties which can be exploited as a sensor material for various sensing applications. Chemically vapor deposited polycrystalline diamond films have outstanding properties of high Young's modulus (for instance, about 1,143 GPa in some forms), low thermal coefficient of expansion (about 1-1.5 ppm/° C. in some forms), high melting temperature (in some forms above 1700° C. in a vacuum or oxygen free environment), ultra-high thermal conductivity (about 2200 W/cm K in some forms), and inertness to most acids and bases.

A fused silica optical fiber is attached to the cavity of the sensor in some embodiments, and in particular embodiments attachment of the diamond diaphragm and/or optical fiber to a sensor housing is accomplished with high temperature ceramic adhesive, a polymer adhesive, or a combination of.

In some forms, the sensor may further comprise a heat transfer device in contact with the diamond diaphragm to assist in removing or redirecting heat applied to the diamond diaphragm, especially in sensors for use in high-temperature environments. In some embodiments, the heat transfer device may comprise one or more cylindrical heat sinks disposed about the sensor housing. In some embodiments the heat transfer device may comprise silicon carbide or tungsten.

FIG. 1 illustrates one form of a fiber-optic pressure sensor 100 formed at the tip of an optical fiber, which comprises a cleaved or polished optical fiber 101, a silicon housing structure 102 having a cavity 103 disposed therein, a polymer adhesive 104 and porous ceramic adhesive 105 joining the optical fiber to the housing structure, and a synthetic polycrystalline diamond pressure sensing diaphragm 106. The polymer adhesive should be capable of forming an airtight seal, and may be, for example, UV curable. Polymer adhesives with a relatively limited working temperature (e.g. 320° C.) may be employed when in combination with a metal or ceramic-based adhesive with a higher working temperature. It has been found that air-sealing ceramic adhesives can damage the diamond diaphragm during curing due to differences in rates of expansion during heating to cure, and therefore ceramic adhesives with relatively low cure temperatures (e.g. 400° C.~600° C.) and relatively high working temperatures (e.g. above 1200° C.) are preferred. The UV-curable adhesive 105 cures quickly upon exposure to ultraviolet wavelengths and seals the cavity 103. The ceramic adhesive 104 added on top of the UV-curable adhesive provides additional stability between the optical fiber 101 and the housing 102, improving linearity of the sensor signal and reduced variations in pressure sensitivity of the device. The diamond diaphragm 106 extends across a side of the housing 102 opposite the side that receives the optical fiber 101, sealing the terminal end of the cavity 103. The diaphragm 106 may be connected to the housing 102 by forming the diamond structure on the housing as a coating, or alternatively may be adhered to the surface of the housing 102. The diamond diaphragm 106 enables the sensor 100 to be used for harsh environment sensing because of diamond's high melting temperature and Young's modulus. An anti-oxidation layer 107 may be added for high temperature applications since diamond tends to suffer from oxidation in oxygen rich environment above 800° C. The anti-oxidation layer may be, for instance, a layer of an aluminum oxide, a titanium oxide, a silicon oxide, or similar compounds, and may be applied to an external surface of the diamond diaphragm by evaporation coating or electron beam evaporation. Increased thermal conductivity of materials forming the sensor can be helpful in minimizing thermal stress in the material and the time constant of temperature measurement.

The inner diameter of the cavity 103 in most embodiments will be slightly larger than the optical fiber 101 to assist in insertion of the fiber and to accommodate adhesive between the fiber and inner walls of the housing 102, and to account for tolerances in cavity formation techniques, tolerances in fiber formation, and tolerances for fiber assembly. For instance, the distance between inner walls of the housing may be, in some embodiments, about 5-15 µm greater than the diameter of the cable, preferably about 10 µm. For instance, the housing may in some embodiments had a cylindrical passage from one end to the other having a diameter of 135 µm for use with commercial optical fiber having a diameter of 125 µm.

The thickness of the diamond layer may be designed to meet the specific pressure sensitivity and maximum pressure ranges, preferably while ensuring a linear sensor response. For instance, in some forms the thickness of the diamond diaphragm may be designed to give a deflection of about 10 nm/psi or higher and to operate at a pressure of 30 psi or higher. In some forms, the thickness of the diamond diaphragm may be about 1.1, 1.2, 1.3, 1.4, or 1.5 µm, or may be thicker for higher temperature sensing. For applications where lower pressures will be detected, the diaphragm may be thinner, while thickness can be increased for use in higher pressure ranges. The addition of an anti-oxidation layer decreases the sensor pressure sensitivity and increase the maximum pressure range. When the diamond diaphragm is relatively thin (for example, 1 micron or less in thickness), the effect of the anti-oxidation layer is more significant. However, if the diamond layer is relatively thick (for example, 3-4 microns), the effect of the anti-oxidation layer is relatively small.

Figure 2:
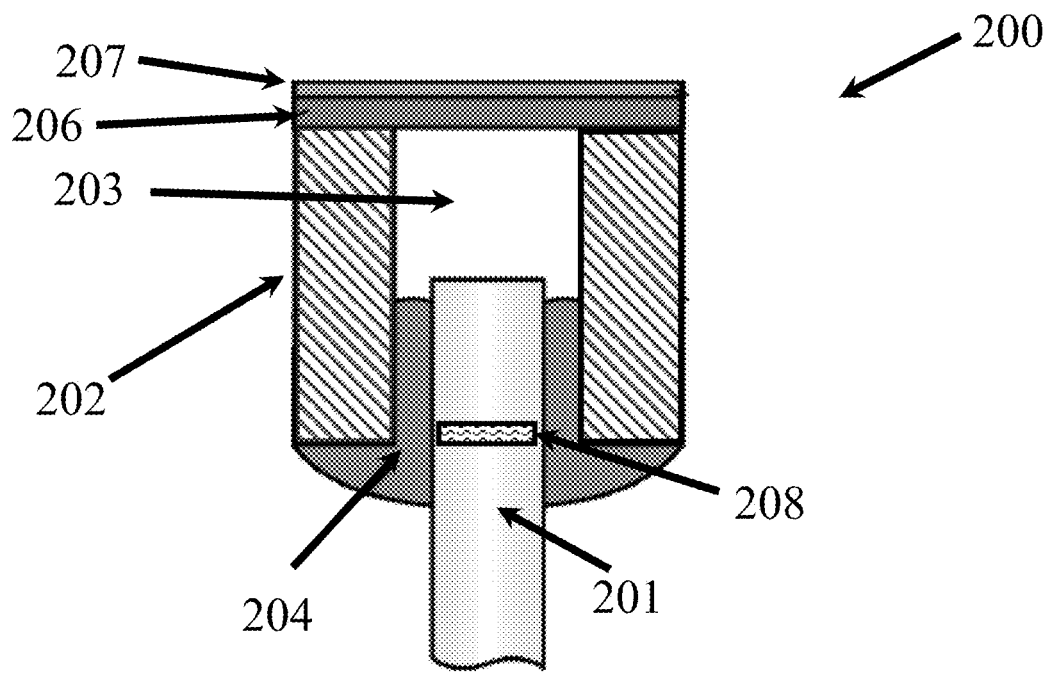
FIG. 2 is a cross-sectional view of an alternative sensor in accordance with several embodiments.

FIG. 2 illustrates another form of sensor comprising a pressure and temperature sensor 200 having an optical fiber 201 mounted within a silicon housing 202 that includes an axial cavity 203. A high temperature adhesive 204, such as a ceramic or metal-based high temperature adhesive, secures the fiber 201 within to the housing 202 and contacts the fiber 201 and interior as well as exterior surfaces of the housing 202. A diamond diaphragm 206 extends across the silicon cavity structure 203, and an anti-oxidation layer 207 is disposed atop the diaphragm 206. The illustrated components have a sealed chamber for pressure sensing. In the illustrated embodiment, an internal mirror layer 208 is disposed with the fiber 201, and may comprise for instance alternating layers of titanium dioxide and silicon dioxide. The mirror layer 208 allows for simultaneous sensing of temperature so that detected pressure changes in the chamber of the sensor due to temperature variation can be accounted for. In the illustrated embodiment, the diamond diaphragm 206 is formed as an integral portion of the housing 202 by growing a circular diamond layer on a silicon wafer using hot filament chemical vapor deposition (HFCVD) and then etching the cavity through the opposite side of the silicon wafer by using deep reactive ion etching (DRIE). Where a plurality of sensors is formed, the etching process may form an array of housings and simultaneously define both the sensor cavity and the boundary space between adjacent devices. When pressure changes occur, the diamond diaphragm 206 with accompanying anti-oxidation layer 207 deflects with respect to the pressure difference between the exterior and interior of the sealed cavity. The deflection of the diaphragm 206 is measured by using an optical sensing technique that makes use of the optical cavity between the diamond diaphragm surfaces and the end surface of optical fiber.

Figure 3:
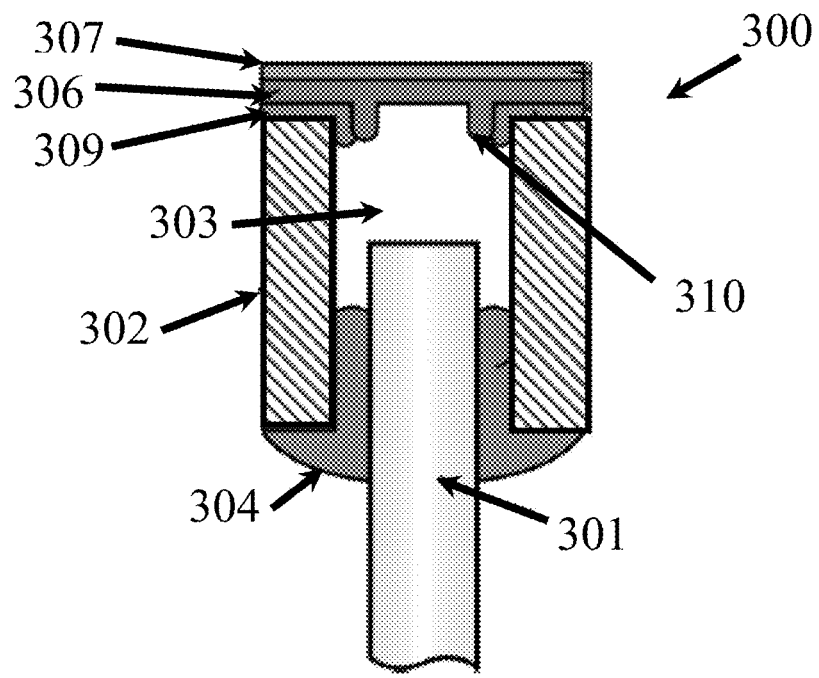
FIG. 3 is a cross-sectional view of another alternative sensor in accordance with some embodiments.

FIG. 3 shows one alternative diamond-based sensor 300 for a higher temperature requirement. The coefficient of thermal expansion (CTE) of silicon is 2.5 µstrain/° C. and that of diamond is 1.0 µstrain/° C. As the temperature increases around the pressure sensor, the thermal expansion of silicon becomes larger than that of diamond and the diaphragm 306 ends up breaking due to excessive tensile stress. To avoid breakage of the diaphragm, a fused silica housing 302 is formed. Fused silica has a CTE of 0.5µ strain/° C., which is smaller than that of diamond. As the temperature increases around the sensor, the diamond diaphragm will go through compression instead of tension, since the thermal expansion of the silica cavity is smaller than that of diamond. Diamond is less likely to fail under compression so the sensor can be operated above 1,000° C. without the risk of diaphragm failure. Ceramic or metal-based high temperature adhesives 309 are applied between the diamond diaphragm 306 and the silica housing 302 instead of growing diamond to the silica cavity structure directly. To increase adhesion performance, a small ridge like structure 310, for instance a concentric ring protruding from the lower surface of the diaphragm, may be added to the diamond diaphragm 306 where the silica housing is aligned and fixed to increase the contact area of adhesive. As with other described embodiments, the opposite side of the cavity may be sealed with adhesive between the optic fiber 301 and housing 302 to form a sealed chamber 303.

Optionally, a heat sink may accompany the sensor in order to dissipate heat and relieve strain on the diaphragm of the device. Referring to FIG. 4a, diamond-based pressure sensor 400 is shown having high temperature packaging in the form of heat transferring structures 421 and 422. Diamond can withstand very high temperatures (up to 1,700° C.) in an environment where there is no oxygen. However, the cavity structure materials, silicon or fused silica, cannot be used above 1,000° C. due to their low melting temperatures. In the case of silica, the material will become brittle after being exposed to temperatures around 1,000° C. To protect the sensor cavity structure from high temperature damage, a sensor package that operates as a thermal barrier and heat sink may be adopted. The illustrated sensor 400 is similar to the device shown in FIG. 1, but the diamond diaphragm 406 (and anti-oxidation coating 407) extend laterally outward to provide a connection for heat conducting structures 421 and 422, which may be portions of a single integral structure such as a tube formed around the sensor housing 402. The heat conducting structures 421 and 422 may be made of a substance that is not easily oxidized, such as silicon carbide or metals such as tungsten or gold. Silicon carbide has a high melting temperature (2,830° C.) and good thermal conductivity (120 W/m·K), making it particularly useful for forming high temperature packaging around a sensor. Heat coming into the diamond diaphragm 406 is taken away through the silicon carbide structures to another heat sink. The silicon carbide sensor package significantly increases the operating temperature of the diamond-based pressure and temperature sensors by protecting the cavity structure materials from high temperatures. Alternative to the arrangement shown, the heat transferring structures 421 and 422 could be bridged to the diamond diaphragm 406 by another material rather than contacting the diaphragm directly, and the diaphragm need not extend laterally beyond the housing 402. In some forms, a plurality of heat conducting structures, such as a series of concentric tubes, may be provided at various distances from the sensor structure. The heat transferring structures may optionally be bonded to the exterior of the sensor housing, such as by high temperature ceramic adhesive, in addition to or alternatively to bonding to the diamond diaphragm.

FIG. 4b illustrates a device similar to that of FIG. 3 but having an added high-temperature package. The sensor 430 includes a housing 432 and a diamond diaphragm 436 extending laterally beyond the housing 432. Heat transferring structures 441 and 442 conduct heat away from the diamond diaphragm 436, and as with FIG. 46 the heat transferring structures 441 and 442 may have various alternative configurations.

FIG. 5 illustrates one example of a fabrication process of a sensor. The illustrated process is cost-efficient and can provide good device-to-device uniformity since the diamond diaphragm and optical housing fabrication processes are performed in batch with very good thickness and dimension control by using conventional semiconductor processes (e.g. chemical vapor deposition, photolithography, and deep reactive ion etching). The rest of fabrication processes can be either easily automated by using motorized precision stages with an optical vision system or performed in batch. Therefore, sensor fabrication can be cost effective and suitable for low-cost applications.

The sensor fabrication process shown in FIG. 5 includes growth of a diamond layer on a silicon substrate, formation of the optical housing structure, and optical fiber alignment and mounting. The detailed steps are shown sequentially in FIG. 5, although variations may be made. In step (a) the diamond layer 501 is grown directly on a silicon substrate 502 such as a wafer. The substrate may have a thickness of about 50 to about 5,000 In some embodiments, a thick heteroepitaxial diamond film is grown in a hot filament chemical vapor deposition (HFCVD) system on single side of polished p-type silicon wafer. The diamond substance is thus fused to the silicon substrate during the deposition process, eliminating the need for adhering the two layers to one another. The thickness of the diamond film may be carefully controlled during the deposition process, and may be for instance about 1.2 µm in thickness. In order to deposit the diamond layer, the silicon substrate may be cleaned and any surface oxide may be removed before the silicon substrates are sonicated in a diamond nano-particle slurry to embed diamond seed particles on the surface. The average crystal size in the diamond slurry may be about 5 nm to about 30, and in some embodiments about 5 nm. The diamond film may be grown using hydrogen and methane as source gases, although any carbon-containing gas may be used to form the diaphragm. During growth, the silicon substrate should be maintained at elevated temperatures, such as 700-1,000° C., and in some embodiments at about 800° C. The pressure sensitivity of the sensor can be precisely tuned in this step according to the application requirements by varying the thickness of the diamond layer. Optionally, the diamond layer can be patterned into individual circular islands on a single substrate using photolithography and reactive ion etching processes to define a plurality of pressure-sensing diaphragms.

As shown in step (b) of FIG. 5, the side of the silicon substrate opposite the diamond layer is patterned and etched using deep reactive ion etching (DRIE) to form a cavity 503 in the form of a passage open at one end of the silicon substrate 502 and ending at the diamond layer 501. The silicon housing structure formed by etching through the entire thickness of the substrate. The diamond layer on the end of the silicon wafer acts as an etch stop because of the large etch ratio difference between silicon and the diamond material, allowing safe etching of a channel through the entirety of the substrate without risk of damaging the diamond layer. Formation of the cavity 503 results in a generally cylindrical hollow housing 504 with a diamond diaphragm at one end.

Steps (c) through (f) of FIG. 5 illustrate insertion and mounting of an optical fiber in the housing 504 formed in steps (a) and (b) using the DRIE process. A single mode optical fiber 505 having a diameter narrower than the housing cavity 503, for instance a commercially available fiber-optic cable having a diameter of 125 µm (SMF-28 Ultra, Corning), may be first cleaved and cleaned to ensure particle free condition before assembly with the housing. Then, the cavity inlet and the fiber are aligned as shown in step (c), for instance by using manual/piezo stages under microscopes. During alignment, the optical fiber 505 is carefully moved toward the cavity 503 of the housing 504, and in some cases partially inserted into the housing structure, while monitoring the gap distance between the cleaved fiber end and the diamond diaphragm surface.

In step (d), when a desired gap distance between the optical fiber and the diamond diaphragm is obtained, a small drop of polymer adhesive, in the illustrated example a UV-curable adhesive, is applied between the fiber and silicon cavity inlet to fix the fiber and seal the formed optical cavity 503 to form a chamber constituting a Fabry-Perot structure. The adhesive may be a cross-linked UV curable polymer. Due to capillary effect, the gap between the cavity wall and the optical fiber is filled.

In step (e) of FIG. 5 the adhesive 506 is cured to fix the fiber 505 to the housing 504. In the illustrated embodiment, ultraviolet light 507, for instance from a spot light source, is exposed to the applied UV curable polymer 506, securing the optical fiber to the cavity and sealing the cavity at the end of the housing that receives the optical fiber. To minimize shrinkage of the UV curable polymer, a low intensity exposure (for instance, about 10% of full intensity) may be applied followed by a high intensity exposure.

In step (f), a second adhesive 508, for instance metal or ceramic adhesive, is applied on top of the polymer adhesive 506, and cured. In some instances, the second adhesive 508 is subjected to heat in order to effect curing. The addition of the second adhesive stabilizes the structure and reduces movement of the fiber 505 relative to the sealed optical chamber 509, significantly improving the linearity of pressure and temperature response by minimizing the viscoelastic behavior of the UV curable polymer.

Figure 6:
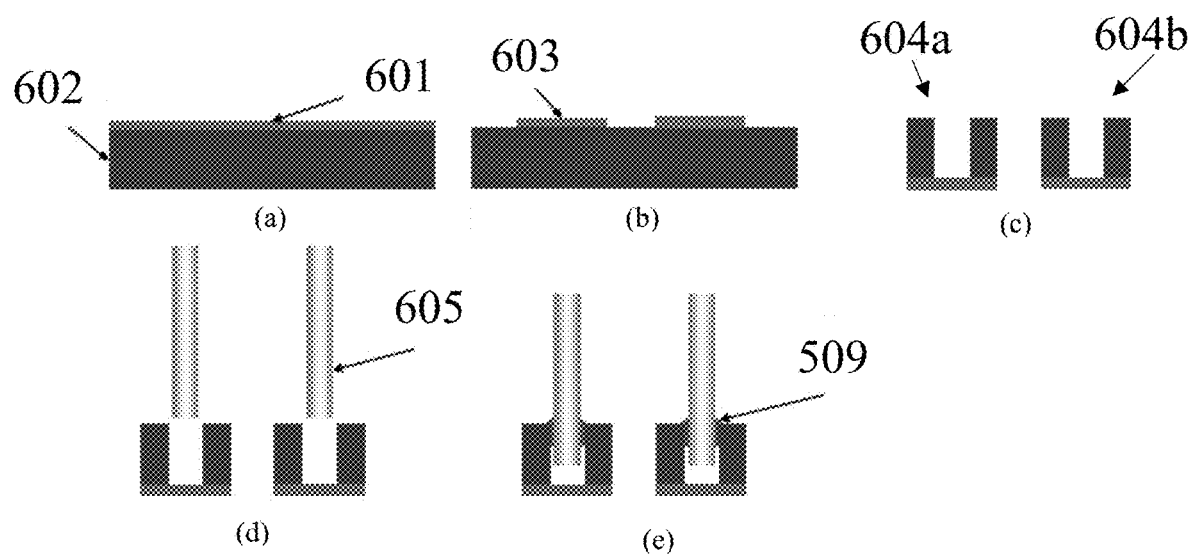
FIG. 6 shows sequential steps of one process for batch manufacturing a plurality of sensors in accordance with several embodiments.

FIG. 6 shows a batch process in which a plurality of sensor structures are formed simultaneously or nearly simultaneously. As in previously discussed embodiments, a continuous diamond layer 601 is formed on a silicon substrate 602, as shown in step (a). However, the silicon substrate 602 is large enough to form a plurality of sensor housings. In step (b) of FIG. 6, the diamond layer is etched into separate regions each forming an island 603 on the single substrate 602, for instance by using photolithography and a reactive ion etching processes to define a plurality of preferably identical diamond structures. In step (c), the substrate 602 is etched to form separate hollow structures, such as tubes, adjacent each diamond island 603. For instance, the side of the silicon substrate opposite the diamond islands 603 may be etched through the entirety of its thickness using deep reactive ion etching (DRIE) to form a plurality of cavities, each centered on a diamond island 603. In some forms, etching also may be applied between diamond islands 603 to provide a plurality of separated hollow housings 604a and 604b such as shown in step (c). A plurality of fused silica optical fibers 605 are then aligned with cavities as shown in step (d) and inserted into the cavities and affixed to the housings with high temperature adhesive 509. The adhesive may be applied to the fibers before insertion and cured after insertion, or applied after insertion of the fibers into the housings. The pressure range of the pressure sensor can be tuned by changing the thickness of the diamond diaphragm based on the pressure range requirements.

Figure 7:
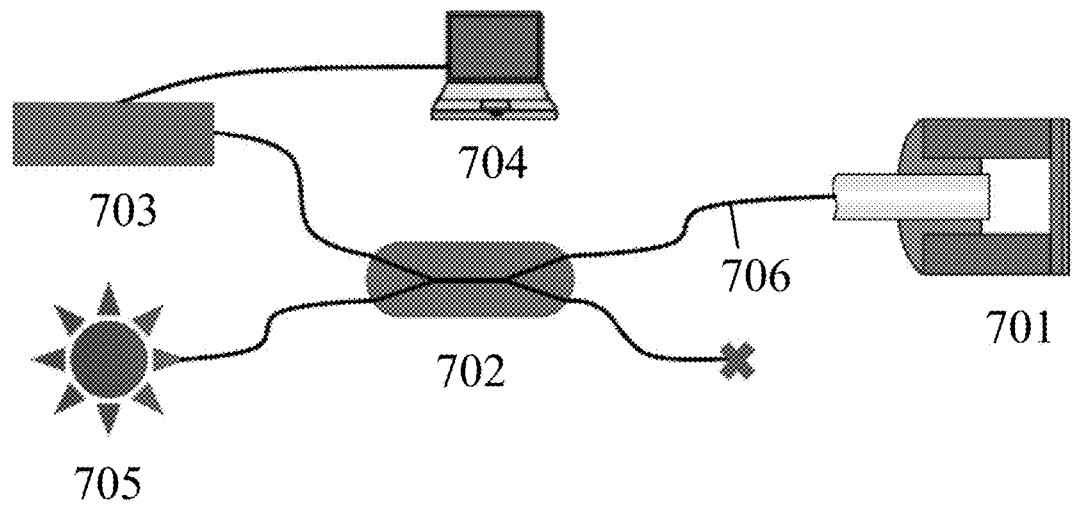
FIG. 7 is a diagram illustrating a broadband optical interrogation system incorporating a pressure sensor in accordance with several embodiments.

As shown in FIG. 7, a sensor 701 of the type previously described may be integrated in broadband optical interrogation system comprising a fiber coupler 702, a spectrometer 703, a signal processing computer 704, and a light source 705. Temperature and/or pressure measurements are performed using an optical signal coupled through the optical fiber 706 extending from the sensor 701. Light from the light source 705 is introduced into the optical fiber and reflected from optical interfaces at the end of the sensor, more specifically an end face of the optical fiber and both surfaces of the diamond diaphragm at the terminal end of the sensor 701. The reflected signal is detected by the spectrometer 703 that is connected to the other end of optical fiber cord 706. When the pressure in the vicinity of the sensor 701 changes, the distance between the optical fiber end face and the diamond diaphragm changes due to the pressure difference between the inside and outside of the sensor cavity. Temperature measurements may be performed by measuring the thickness change of the diamond diaphragm. The thickness of diamond diaphragm layer has a linear relationship with the ambient temperature because of the thermal expansion of the material.

Figures 8A, 8B:
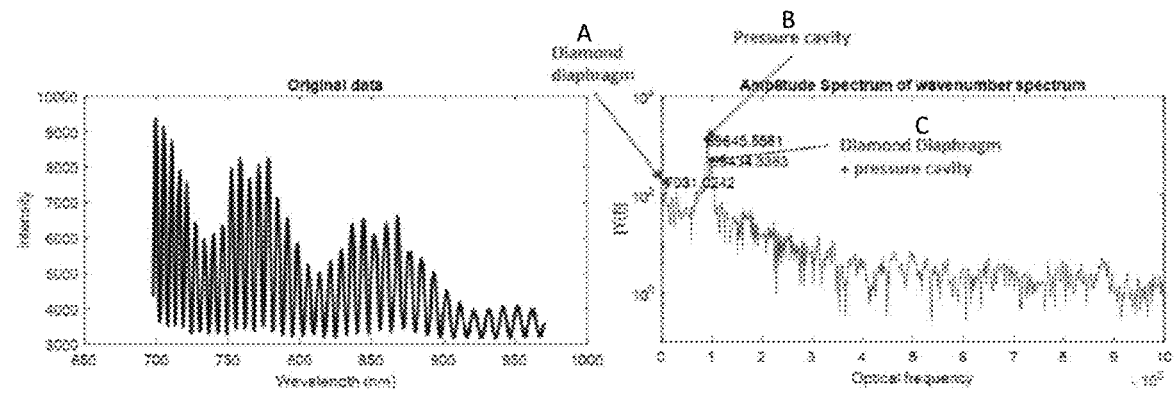
FIGS. 8(a) and 8(b) show an optical signal spectrum and related Fast Fourier Transform, respectively, in accordance with some embodiments.

The optical signal reflected from the sensor 701 is composed of three inference signals from three different optical interfaces. There are interferences among these three signals and a superimposed interference spectrum is observed from the fabricated sensors. A representative sensor spectrum is shown in FIG. 8(*a*). By doing a Fast Fourier Transform (FFT) to the acquired spectrum, each interference signal component can be identified. Those components are shown as peaks in the FFT result (FIG. 8(*b*)), with A indicating the diamond diaphragm, B indicating the pressure cavity, and C indicating the diamond diaphragm plus the pressure cavity. By performing bandpass filtering for each component and an optical demodulation technique, the cavity length of the sensor and the thickness of the diamond film may be individually calculated. The temperature and pressure measurements may be accomplished by using the calculated cavity lengths and the relationship between the cavity lengths and temperature/pressure. The relationship between the cavity length and temperature/pressure is found by a calibration process before the actual measurements.

Example 1

A sensor was fabricated by i) growth of a diamond diaphragm layer on a silicon wafer, ii) fabrication of an optical housing structure by removing portions of the silicon wafer, and iii) optical fiber alignment and mounting within the optical housing.

The first step involved growing the diamond layer on the silicon wafer. A 1.2 µm thick heteroepitaxial diamond film was formed in a hot filament chemical vapor deposition (HFCVD) system on single side polished p-type silicon wafers. After cleaning and then removing the surface oxide, the silicon wafers were sonicated in a diamond nano-particle slurry to embed diamond seed particles on the surface. The average crystal size in the diamond slurry was 5 nm. The diamond film was grown using hydrogen and methane as the source gases. During growth, the silicon wafer was maintained at 800° C. The pressure sensitivity of the sensor was precisely tuned in this step according to the application requirements.

Secondly, the backside of the silicon wafer was patterned and etched using deep reactive ion etching (DRIE). Each individual silicon wafer was formed into a tubular structure by etching through the entire 350 µm thickness of the wafer. The diamond layer on the front side of the silicon wafer was not affected by etching, and acted as an etch stop because of the large etch ratio difference between silicon and diamond layer.

Finally, an optical fiber was inserted into each tubular silicon housing defined by the DRIE process. For each housing, a single mode optical fiber with a diameter of 125 µm (SMF-28 Ultra, Corning) was first cleaved and cleaned to ensure particle free condition before the assembly. Then, the cavity inlet and the fiber were aligned using manual/piezo stages under microscopes. The alignment setup included two 5-axis high precision manual stages with attached piezo stages and two optical microscopes with CCD cameras positioned with 90-degree angle separation. The optical fiber was then carefully inserted into the housing structure while monitoring the gap distance between the cleaved fiber end the diamond diaphragm surface using the system described for use in sensor interrogation in Example 2. The cavity length was measured and controlled with a resolution of less than 1 nm by using the optical interrogation system. Horizontal position and tilt alignment were ensured by the clearance between the silicon housing and the inserted optical fiber. When a desired gap distance between the optical fiber and the diamond diaphragm was obtained, a small drop of UV curable adhesive (OP-5-20632, Dymax, Torrington, Conn.) was applied between the fiber and silicon cavity inlet to fix the fiber and seal the formed optical cavity. The gap between the cavity wall and the optical fiber was filled with adhesive by capillary effect. UV light from a spot light source was then exposed to the applied UV curable polymer securing the optical fiber to the cavity and sealing the air cavity near the end of the optical fiber. To minimize shrinkage of the UV curable polymer, a low intensity exposure (10% of the full intensity for 30 second) was applied followed by a high intensity exposure (100% of the full intensity for 60 second). The silicon structure holding the silicon housing structure was then broken off by applying minimal force. Additional ceramic adhesive (618-N-VFG, Aremco) was applied on top of the cross-linked UV curable polymer and thermally cured after 4 hours of air drying. Thermal curing was performed at 150° C. and 300° C. for 2 hours at each temperature.

Example 2

The sensors from Example 1 were connected to a broadband optical interrogation system that included a 3 dB coupler (50:50 coupling ratio at λ=780 nm, Thorlabs, Newton, N.J.), a broadband spectrometer (flame-T, Ocean Optics, Largo, Fla.) with 0.4 nm wavelength resolution, and a broadband light source (HL-2000-HP, Ocean Optics). The spectrum position and the output of the reference sensor were collected by custom data acquisition code based on LabVIEW (National Instruments, Austin Tex.) while the chamber pressure and temperature were changed independently using a pressure regulator (Type 10, Bellofram Corp., Newell, W. Va.) and temperature controller (CN77332, Omega Engineering, Norwalk, Conn.) with a thermocouple (CO1-K, Omega Engineering) and two heaters (KH-103/10, Omega Engineering, Norwalk, Conn.). Frequency isolation using bandpass filtering and one peak tracing were used to monitor the optical cavity length change with high resolution. Additional details may be found in Bae et al. (2019), Miniature Diamond-Based Fiber Optic Pressure Sensor with Dual Polymer-Ceramic Adhesives, Sensors 19(9), 2202, which is hereby incorporated by reference as if fully set forth herein.

Figure 9:
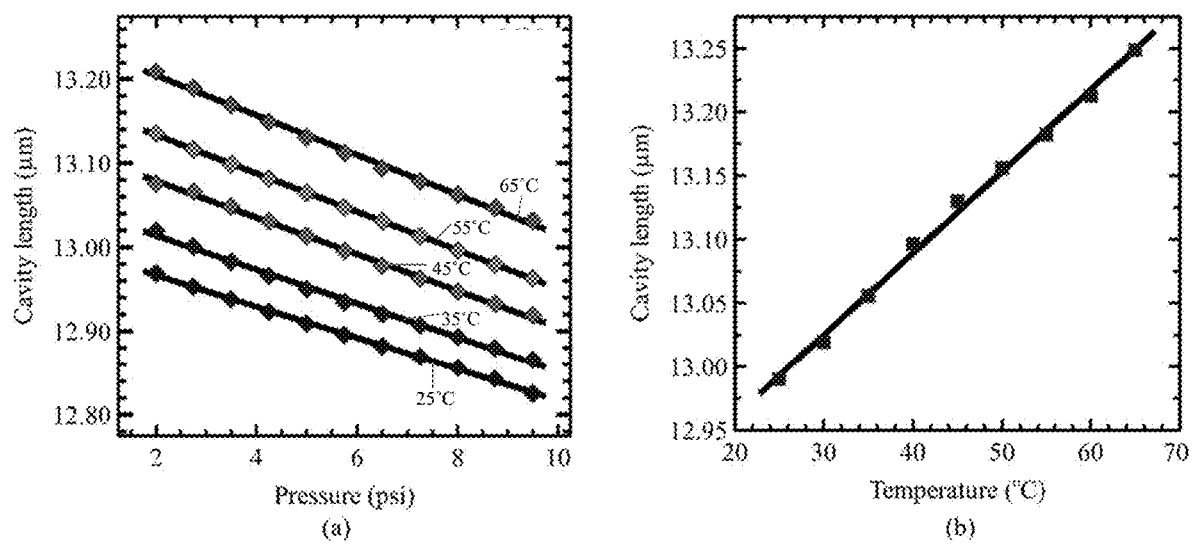
FIG. 9 shows a calibration result for a sensor in accordance with some embodiments.

Pressure calibration of the sensor was conducted in a pressure chamber with a reference pressure sensor (MMG250V10P3C0T4A5CE, Omega Engineering Inc.) to quantify the changes in the sensor air cavity length with respect to the pressure changes. The calibration was performed in a pressure range of 2 to 9.5 psi. The calibration result is shown in FIG. 9. The calibration data shows good linearity with an $R^2$ value of 0.9979 and sensitivity of 18.5 nm/psi for combined data from increasing and decreasing pressure with a step size of 0.5 psi at room temperature of 24.5° C. The pressure calibration result from a sensor without the added ceramic adhesive was compared, showing that $R^2$ improved by 1.5% and the pressure sensitivity decreased by 48% after applying the ceramic adhesive. It is believed that the applied ceramic adhesive significantly reduced the deformation and viscoelastic behavior of the UV curable adhesive due to its high Young's modulus compared to that of the UV curable adhesive. Due to UV curable polymer shrinkage during the thermal curing of the ceramic adhesive, 8.3% cavity length shrinkage was also observed.

Pressure calibrations were performed at five different temperatures from 25 to 65° C. with 0.75 psi step size as shown in part (a) of FIG. 9. The pressure sensitivity of the sensor was noted to increase with the increase of the air cavity length as the temperature increases. The pressure sensitivity increased from 18.6 to 23.7 nm/psi when the temperature increased from 25 to 65° C. The increase in the pressure sensitivity with the increase in temperature is believed to come from softening of the UV curable adhesive in the sensor that was used with ceramic adhesive. A sensor without the ceramic adhesive shows 4.3 times larger sensitivity variation than that of a sensor with the ceramic adhesive in the same temperature range (i.e. from 25 to 65° C.).

To evaluate the temperature sensitivity of the sensor, temperature calibration of the air cavity was performed. To measure the temperature sensitivity, the sensor was heated from 25 to 65° C. with an increment of 5° C. under the constant pressure of 2 psi. The cavity lengths were recorded at each temperature level. The obtained temperature calibration results are shown in part (b) of FIG. 9. According to the result, a linear relationship between the air cavity length and temperature can be observed with good linearity ($R^2$=0.9965) and a sensitivity of about 6.4 µm/° C. The change of the cavity length due to temperature change can be compensated by adding an additional Fabry-Perot or other types of temperature sensors (e.g. fiber Bragg grating).

To investigate the maximum operating temperature of the sensor, an additional temperature calibration was performed with a larger temperature range than the previous temperature calibration. For the calibration, the sensor was heated from 25° C. to 325° C. with an increment of 25° C. under the atmospheric pressure. The cavity lengths were recorded at each temperature level. A relatively linear relationship between air cavity length and temperature was observed up to 275° C., which is believed to be the maximum operating temperature of the sensor. This operating temperature was much higher than the glass transition temperature of the applied UV adhesive (78° C.).

Those skilled in the art will recognize that a wide variety of other modifications, alterations, and combinations can also be made with respect to the above described embodiments without departing from the scope of the invention, and that such modifications, alterations, and combinations are to be viewed as being within the ambit of the inventive concept.

What is claimed is:

1. A sensor comprising:
    a housing having a cavity extending from a first end of the housing to a second end of the housing;
    a diamond diaphragm extending across the cavity at the first end of the housing; and
    an optical cable disposed in the cavity at the second end of the housing;
    wherein the optical cable is mounted to the housing with a UV curable adhesive and a ceramic adhesive, and
    wherein the housing comprises silicon.

2. The sensor of claim 1, wherein the diamond diaphragm comprises polycrystalline diamond.

3. The sensor of claim 1, further comprising an anti-oxidation barrier disposed on a side of the diamond diaphragm opposite the housing structure.

4. The sensor of claim 3, wherein the anti-oxidation layer comprises titanium oxide, silicon oxide, aluminum oxide, or combinations thereof.

5. The sensor of claim 1, further comprising a heat transfer device in contact with the diamond diaphragm.

6. The sensor of claim 5, wherein the heat transfer device comprises silicon carbide or tungsten.

7. A method of manufacturing a sensor, comprising:
    depositing a diamond film layer on a first side of a silicon substrate;
    etching a cavity in a second side of the silicon substrate, the cavity extending from the second side of the substrate to the diamond film layer;
    disposing a cable within the cavity at the second side of the substrate; and
    joining the optical cable to the silicon substrate with at least one adhesive.

8. The method of claim 7, wherein depositing the diamond film layer comprises a hot filament chemical vapor deposition.

9. The method of claim 7, where in the etching the cavity in the silicon substrate comprises deep reactive ion etching.

10. The method of claim 7, wherein joining the optical cable to the silicon substrate comprises applying a UV-curable adhesive to the optical cable, subjecting the UV-curable adhesive to ultraviolet radiation when the UV-curable adhesive is in contact with the optical cable and the substrate in an amount effective to cure the UV-curable adhesive, and applying a ceramic adhesive to the UV-curable adhesive.

11. A method of manufacturing a plurality of sensors, the method comprising:
    depositing a diamond film layer on a first side of a silicon substrate;
    etching the diamond film layer to form a plurality of separate diamond film areas;
    etching a plurality of cavities in a second side of the silicon substrate, the each of the plurality of cavities located opposite a diamond film area, the cavities extending from the second side of the substrate to the diamond film areas;

disposing a plurality of optical cables within the cavities at the second side of the substrate, with one cable per cavity; and joining the optical cables to the cavities with at least one adhesive.

12. The method of claim 11, further comprising etching the substrate between diamond film areas to separate the substrate into a plurality of housing structures.

13. The method of claim 11, where in the etching the cavity in the silicon substrate comprises deep reactive ion etching.

14. The method of claim 11, wherein joining the optical cables to the cavities comprises applying a UV-curable adhesive to each optical cable, subjecting the UV-curable adhesive to ultraviolet radiation when the UV-curable adhesive is in contact with the optical cable and at least interior surfaces of the cavities, and applying a ceramic adhesive to the UV-curable adhesive at each cavity.

15. A sensor comprising:
a housing having a cavity extending from a first end of the housing to a second end of the housing;
a diamond diaphragm extending across the cavity at the first end of the housing;
an optical cable disposed in the cavity at the second end of the housing; and
an anti-oxidation barrier disposed on a side of the diamond diaphragm opposite the housing structure;
wherein the optical cable is mounted to the housing with a UV curable adhesive and a ceramic adhesive.

16. The sensor of claim 15, wherein the anti-oxidation layer comprises titanium oxide, silicon oxide, aluminum oxide, or combinations thereof.

17. A sensor comprising:
a housing having a cavity extending from a first end of the housing to a second end of the housing;
a diamond diaphragm extending across the cavity at the first end of the housing;
an optical cable disposed in the cavity at the second end of the housing; and
a heat transfer device in contact with the diamond diaphragm;
wherein the optical cable is mounted to the housing with a UV curable adhesive and a ceramic adhesive, and
the heat transfer device comprises silicon carbide or tungsten.

* * * * *